(12) United States Patent
Furuta et al.

(10) Patent No.: US 7,084,001 B2
(45) Date of Patent: Aug. 1, 2006

(54) METHOD OF FORMING FILM INCLUDING A COMB TOOTH PATTERNING FILM

(75) Inventors: Kenichi Furuta, Tokyo (JP); Takahiro Imayoshi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/732,213

(22) Filed: Dec. 11, 2003

(65) Prior Publication Data

US 2004/0229417 A1    Nov. 18, 2004

(30) Foreign Application Priority Data

Dec. 11, 2002   (JP) ............................. 2002-359381

(51) Int. Cl.
*H01L 21/00* (2006.01)
*H01L 21/336* (2006.01)
*H01L 21/44* (2006.01)

(52) U.S. Cl. ..................... 438/98; 438/269; 438/670
(58) Field of Classification Search ................. 438/98, 438/269, 670
See application file for complete search history.

(56) References Cited

U.S. PATENT DOCUMENTS

| | | | | |
|---|---|---|---|---|
| 4,536,421 A | * | 8/1985 | Matsuzawa et al. | 427/282 |
| 4,771,017 A | * | 9/1988 | Tobin et al. | 438/98 |
| 5,834,802 A | * | 11/1998 | Takahashi et al. | 257/280 |
| 6,271,069 B1 | * | 8/2001 | Chen et al. | 438/204 |

FOREIGN PATENT DOCUMENTS

| | | | |
|---|---|---|---|
| JP | 53-111279 | | 9/1978 |
| JP | 03-218641 | | 9/1991 |
| JP | 6-104256 | | 4/1994 |
| JP | 07-307349 | | 11/1995 |
| JP | 10-41777 | * | 2/1998 |
| JP | 2000-340580 | | 12/2000 |

* cited by examiner

*Primary Examiner*—William M. Brewster
(74) *Attorney, Agent, or Firm*—Takeuchi & Kubotera, LLP

(57) ABSTRACT

Resist patterns (R11 and R12) are formed such that an opening between both the films is aligned to the position, where the source electrode (7) is formed, while the region on the $N^+$-layer (5), where the drain electrode (8) is formed afterwards, is covered by the resist film (R11). After ohmic electrode material is applied from a direction perpendicular to a semiconductor substrate (1), the resist films (R11 and R12) are removed with the ohmic electrode films (OM11 and OM12). The remaining ohmic electrode film (OM14) functions as the source electrode (7). After the above-described first lift off process, the second lift off process is performed to form a drain electrode (8) on the $N^+$-layer (5).

15 Claims, 6 Drawing Sheets

METHOD OF FORMING FILM INCLUDING A COMB TOOTH PATTERNING FILM

BACKGROUND OF THE INVENTION

1. Field of the Invention

This invention relates to a method of forming a film for a semiconductor device.

2. Description of the Related Art

A lift off method has been used for patterning of a thin film to which etching is difficult. For example, an electrode film of a transistor is formed by the lift off method. When forming the electrode film by the lift off method, a resist (or a metal) is applied to a substrate surface to form a resist pattern having a shape opposite to that of the electrode film. Then, a material of the electrode film is applied onto the resist pattern by vapor deposition or sputtering. Then, an electrode material film deposited on the resist film is removed together with the resist film. The remainder of the removed electrode material film becomes the electrode film.

In the lift off process, the resist film is formed such that it has a vertical sectional shape of a reverse-trapezoid. That is, the resist film is patterned such that the upper side thereof has a width larger than that of the lower side thereof. When the resist film has such a shape, unnecessary part of the electrode material film on the resist film can be separated, for removal, from necessary part of the electrode material film, which becomes the final electrode film. The pattern forming by the lift off method is disclosed in Japanese Patent Application Kokai Number 6-104256.

As the integration of a semiconductor device advances, the distance between drain and source electrodes of a transistor has been reduced. For example, when forming drain and source electrodes with the distance therebetween of 2 μm, the width of the upper surface of the resist film formed between the regions of both the electrodes is also made approximately 2 μm in the manufacturing process. As described above, the resist film for the lift off process has the shape of reverse-trapezoid so that the width of the lower surface thereof must be made smaller than that of the upper surface (for example, 1.3 μm or less) if formed in accordance with the conventional method.

However, when the width of the lower surface is made small, it is possible that the resist film slopes and collapses in the worst case. If the resist film slopes, the drain and source electrodes cannot be formed at predetermined positions with predetermined shapes, causing adverse effects on the quality of the transistor.

BRIEF SUMMARY OF THE INVENTION

Accordingly, it is an object of the present invention to provide a method of forming a film, wherein a fine pattern can be formed precisely by using the list off method.

According to an aspect of the present invention, a method of forming a film, comprises the steps of a first step of forming a first pattern film, a second step of depositing a first material for a first functional film using the first pattern film, a third step of removing the first material, which is deposited on the first pattern film, with the first pattern film so that only the first material deposited in a region, which is not covered with the first pattern film, is left as the first functional film, a fourth step of forming a second pattern film, a fifth step of depositing a second material for a second functional film using the second pattern film, and a sixth step of removing the second material, which is deposited on the second pattern film, with the second pattern film so that only the second material deposited in a region, which is not covered with the second pattern film, is left as the second functional film. According to this method, the first lift off process (first to third steps) and the second lift off process (fourth to sixth steps) are performed continuously. Consequently, the first and second functional films can be formed in close to each other. Also, the first and second functional films can have different characteristics and thickness from each other.

According to another aspect of the invention, a method of forming a film comprises the steps of, a first step of forming a pattern film, a second step of depositing a material for first and second functional films using the pattern film, and a third step of removing said material, which is deposited on the pattern film, with the pattern film so that the material deposited in a first region, which is not covered with the pattern film, is left as the first functional film and the material deposited in a second region, which is not covered with the pattern film, is left as the second functional film. In the first step, a shape of the pattern film is formed such that a bottom surface of the first functional film has at least one projecting portion extending toward the second functional film and/or a bottom surface of the second functional film has at least one projecting portion extending toward the first functional film. According to the method, the first and second functional films can be formed in close to each other by only one lift off process. If the positions of the projecting portions of the first and second functional films are aligned to each other, the distance of both the films becomes smaller.

In case that the first and second functional films are, for example, electrode films, a large amount of electrical charges is collected at corners of the respective projecting portions. It is preferred that the corners are chamfered so as to have curvatures, thus preventing the concentration of electrical charges.

If the pattern film has at least one dented portion at an edge of an upper surface thereof on a side of the first functional film and at least one dented portion at an edge of the upper surface thereof on a side of the second functional film, dented portions are formed in the bottom surface of the first and second functional films by performing the second step.

If the pattern film has at least one projecting portion at an edge of a bottom surface thereof on a side of the first functional film and at least one projecting portion at an edge of the bottom surface thereof on a side of the second functional film, the posture of the pattern film is stabilized even if the distance between the first and second functional films is made small.

DESCRIPTION OF THE PREFERRED EMBODIMENT

Figure 1:
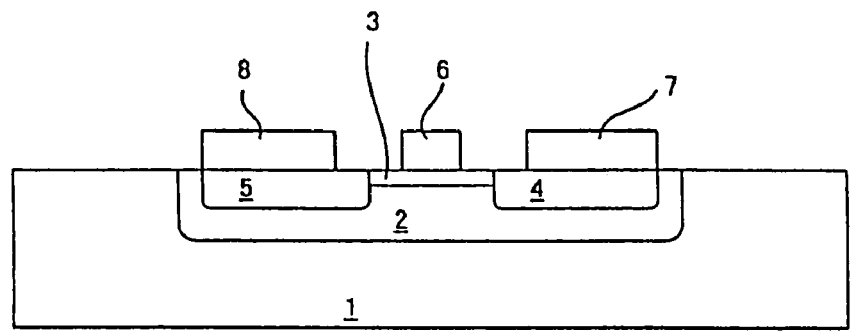
FIG. 1 is a sectional view of a general field effect transistor (FET).

Preferred embodiments of the present invention will now be described with reference to the accompanying drawings. In the description and the drawings, an element having similar functions and structures is given the same reference numeral and description thereof is omitted.

In FIG. 1, a general FET comprises a semiconductor substrate 1 (GaAs), a P-type well 2 (P-layer) formed in the substrate 1, and three impurity diffused regions formed in the P-layer; an N-type impurity diffused region (N-layer 3) for a channel, an $N^+$-type impurity diffused region ($N^+$-layer 4) for a source, and an $N^+$-type impurity diffused region ($N^+$-layer 5) for a drain. Gate, source, and drain electrodes 6, 7, and 8 are formed above the N-layer 3, $N^+$-layer 4, and $N^+$-layer 5, respectively.

When a voltage equal to or more than a threshold voltage is applied to the gate electrode 6 and a positive voltage is applied to the drain electrode 8, the depletion layer of the N-layer 3 directly under the gate electrode 6 becomes short so that current flows from the drain electrode 8 to the source electrode 7. On the other hand, when a voltage less than the threshold voltage is applied to the gate electrode 6 and a positive voltage is applied to the drain electrode 8, the depletion layer of the N-layer 3 becomes long so that current stops flowing between the drain and source electrodes 8 and 7.

The general manufacturing method for the FET of FIG. 1 will be described.

Figure 2:
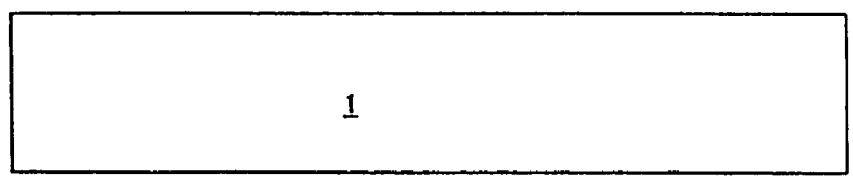
FIG. 2 is the first process according to a general manufacturing method for the FET.

In the first process shown in FIG. 2, the semiconductor substrate 1 is prepared.

Figure 3:
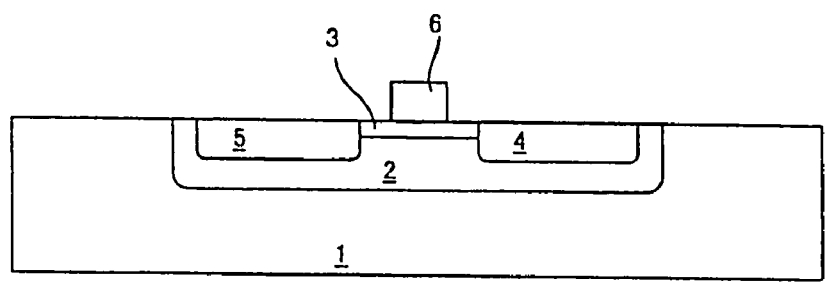
FIG. 3 is the second process according to the general manufacturing method for the FET.

In the second process shown in FIG. 3, the P-layer 2, N-layer 3, $N^+$-layer 4, and $N^+$-layer 5 are formed in the substrate 1. The gate electrode 6 is formed in the N-layer 3.

Figure 4:
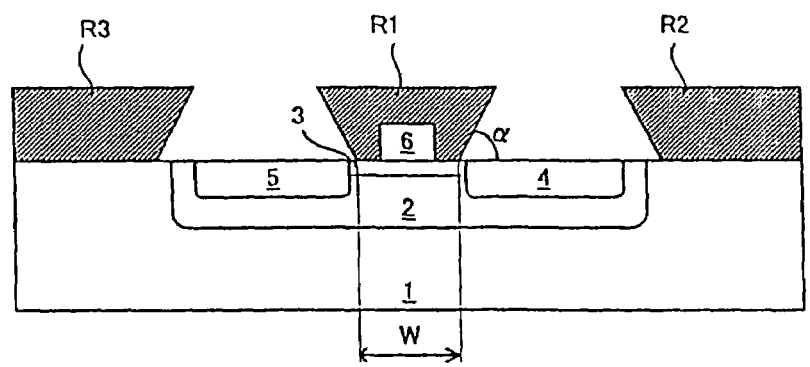
FIG. 4 is the third process according to the general manufacturing method for the FET.

In the third process shown in FIG. 4, a resist is coated and a photolithography is performed to form resist films R1, R2, and R3. An opening between the resist films R1 and R2 is aligned to the position where the source electrode 7 is formed, and an opening between the resist films R1 and R3 is aligned to the position where the drain electrode 8 is formed. The resist films R1, R2, and R3 are formed such that the sides thereof form an acute angle (approximately 70°) with respect to the upper surface of the substrate 1. In FIG. 4, the respective resist films R1. R2, and R3 are generally formed at a time in spite of the individual reference characters.

Figure 5:
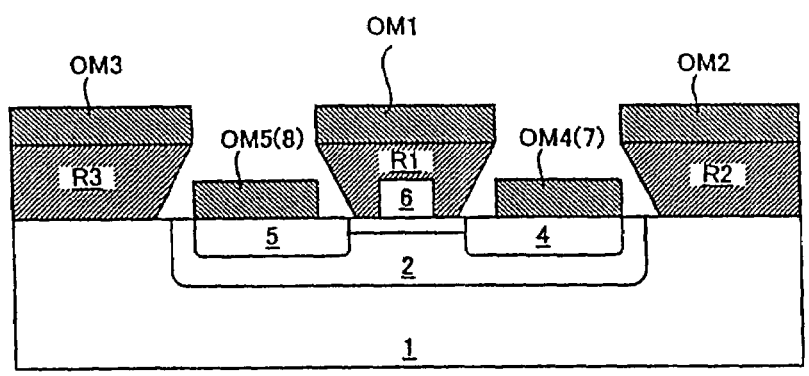
FIG. 5 is the fourth process according to the general manufacturing method for the FET.

In the fourth process shown in FIG. 5, an ohmic electrode material is applied from a direction perpendicular to the surface of the substrate 1 by vapor deposition or sputtering method. Since the resist films R1, R2, and R3 have the shapes of reverse-trapezoid, the ohmic electrode material is deposited on the upper surfaces of the resist films R1 to R3 and in the openings between the resist films R1 and R2, and the resist films R1 and R3 to form ohmic electrode films OM1, OM2, OM3, OM4, and OM5, respectively.

In the fifth process, the resist films R1, R2, and R3 are removed with the ohmic electrode films OM1, OM2, and OM3 formed thereon. The respective resist films R1, R2, and R3 are formed to have the reverse-trapezoid in the third process so that the respective ohmic electrode films OM1 to OM5 are deposited in a completely separated condition in the fourth process. Accordingly, only the ohmic electrode films OM1, OM2, and OM3 can be removed with the ohmic electrode films OM4 and OM5 left on the substrate 1.

The FET of FIG. 1 is provided through the above-described first to fifth process. The remaining ohmic electrode films OM4 and OM5 are function as the source and drain electrodes 7 an 8, respectively. The process, which forms the reverse-trapezoid-shaped resist films R1–R3, and removes the ohmic electrode films OM1–OM3 deposited on the resist film R1–R3 with these resist films R1–R3, is called "lift off".

According to an ordinary lift off method, when the thickness of the ohmic film OM1–OM5 is 5,000 Å, the thickness of the resist film R1–R3 is required to be 10,000 Å. Under the condition, for example, if the distance between the source and drain electrodes 7 and 8 is 2 μm, the width W of the lower surface of the resist film R1 becomes 1.3 μm or less (FIG. 4). When the width W of the lower surface of the resist film R1 is as small as this value, the resist film R1 slopes (or collapses) so that the positions of the ohmic electrode film OM4 (source electrode 7) and ohmic electrode film OM5 (drain electrode 8) may be deviated.

According to the invention, however, it is possible to form the ohmic electrode films OM4 and OM5 at predetermined positions accurately even when the distance between them is small.

(First Embodiment)

In the first process, a semiconductor substrate 1 is prepared (FIG. 2).

Figure 6:
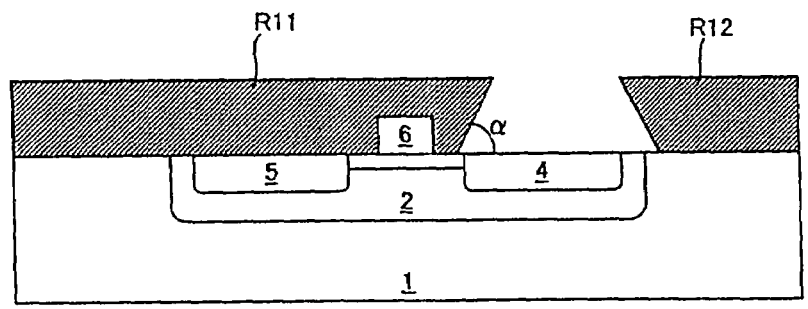
FIG. 6 is the third manufacturing process for the FET according to the first embodiment of the present invention.

In the second process, the P-layer 2, N-layer 3, N+-layer 4, and N+-layer 5 are formed in the substrate 1. The gate electrode 6 is formed in the N-layer 3 (FIG. 3). In the third process shown in FIG. 6, a resist is coated and a photolithography is performed to form resist films (first pattern films) R11 and R12. An opening between the resist films R11 and R12 is aligned to the position where the source electrode 7 is formed. The resist films R11 and R12 are formed such that the sides thereof form an acute angle (approximately 70°) with respect to the upper surface of the substrate 1. A region where the drain electrode 8 is formed afterwards is covered by the resist film R11.

Figure 7:
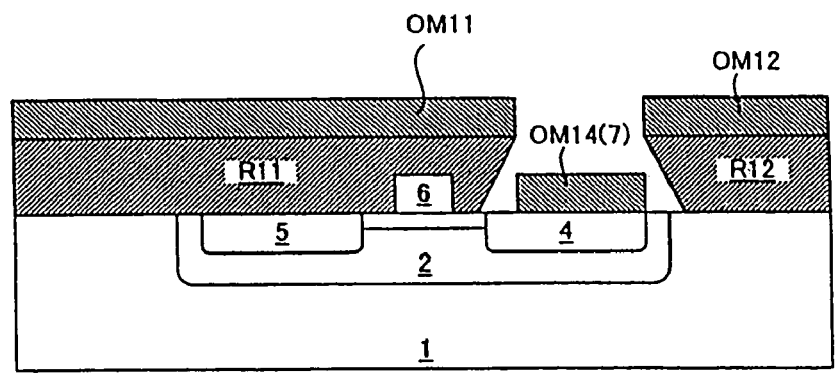
FIG. 7 is the fourth manufacturing process for the FET according to the first embodiment of the present invention.

In the fourth process shown in FIG. 7, an ohmic electrode material is applied from a direction perpendicular to the surface of the substrate 1 by vapor deposition or sputtering method. Since the resist films R11 and R12 have the shapes of reverse-trapezoid, the ohmic electrode material is deposited on the upper surfaces of the resist film R11 and R12 and in the opening between the resist film R11 and R12 to form ohmic electrode films OM11, OM12, and OM14, respectively.

Figure 8:
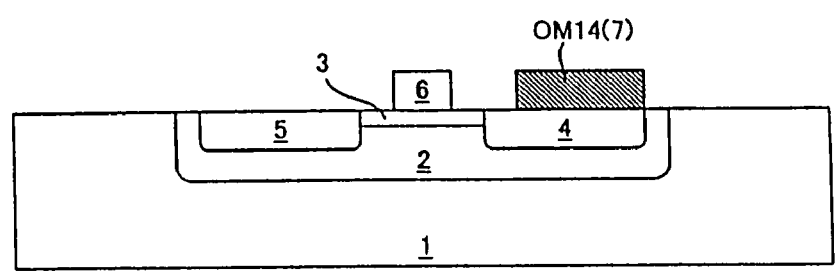
FIG. 8 is the fifth manufacturing process for the FET according to the first embodiment of the present invention.

In the fifth process shown in FIG. 8, the resist films R11 and R12 are removed with the ohmic electrode films OM11 and OM12 formed thereon. The respective resist films R11 and R12 are formed to have the reverse-trapezoid in the third process so that the respective ohmic electrode films OM11, OM12 and OM14 are deposited in a completely separated condition in the fourth process. Accordingly, only the ohmic electrode films OM11 and OM12 can be removed with the ohmic electrode film OM14 left on the substrate 1. The remaining ohmic electrode film OM14 functions as the source electrode 7.

Figure 9:
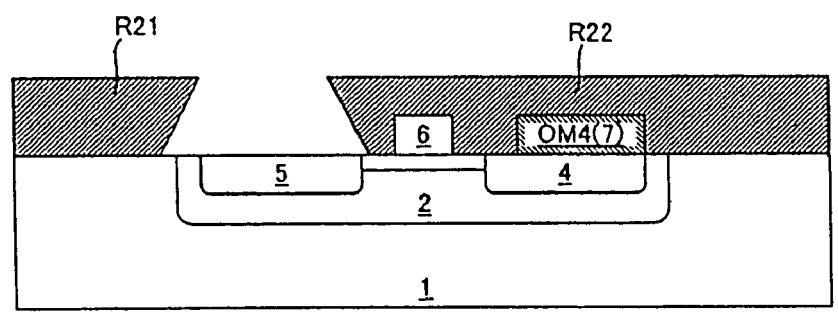
FIG. 9 is the sixth manufacturing process for the FET according to the first embodiment of the present invention.

In the sixth process shown in FIG. 9, a resist is coated and a photolithography is performed to form resist films (second pattern films) R21 and R22. An opening between the resist films R21 and R22 is aligned to the position where the drain electrode 8 is formed. The resist films R21 and R22 are formed such that the sides thereof form an acute angle (approximately 70°) with respect to the upper surface of the substrate 1. A region where the source electrode 7 has been formed is covered by the resist film R22.

Figure 10:
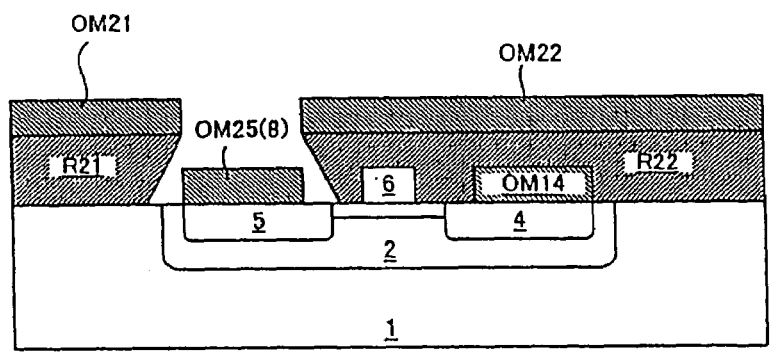
FIG. 10 is the seventh manufacturing process for the FET according to the first embodiment of the present invention.

In the seventh process shown in FIG. 10, an ohmic electrode material is applied from a direction perpendicular to the surface of the substrate 1 by vapor deposition or sputtering method. Since the resist films R21 and R22 have the shapes of reverse-trapezoid, the ohmic electrode material is deposited on the upper surfaces of the resist film R21 and R22 and in the opening between the resist film R21 and R22 to form ohmic electrode films OM21, OM22, and OM25, respectively.

Figure 11:
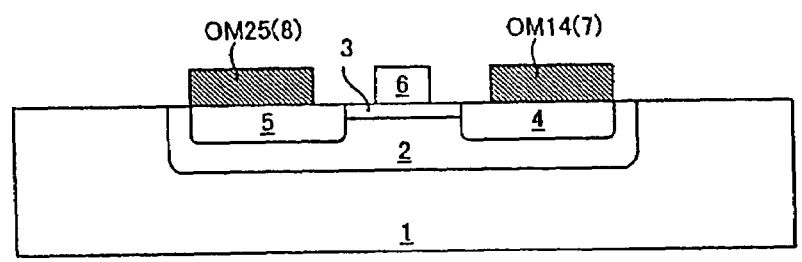
FIG. 11 is the eighth manufacturing process for the FET according to the first embodiment of the present invention.

In the eighth process shown in FIG. 11, the resist films R21 and R22 are removed with the ohmic electrode films OM21 and OM22 formed thereon. The respective resist films R21 and R22 are formed to have the reverse-trapezoid in the sixth process so that the respective ohmic electrode films OM21, OM22 and OM25 are deposited in a completely separated condition in the seventh process. Accordingly, only the ohmic electrode films OM21 and OM22 can be removed with the ohmic electrode film OM25 left on the substrate 1. The remaining ohmic electrode film OM25 functions as the drain electrode 8.

The FET of FIG. 1 is provided through the above-described first to eighth process. According to the first embodiment, each individual lift off process is performed to form the source and drain electrodes 7 and 8. The lift off process (the first to fifth process) to form the source electrode 7 and the lift off process (the sixth to eighth process) to from the drain electrode 8 are continuously performed.

The source and drain electrodes 7 and 8 can be formed at the respective predetermined positions by performing the two lift off processes, even if the distance between the two electrodes is small. When the distance between the source and drain electrodes 7 and 8 becomes small, the resistances between the gate and source, and the gate and drain are reduced, which improves various characteristics, such as cut-off frequency, of the FET.

In addition, the source and drain electrodes 7 and 8 are formed by different process so that different material and thickness can be used for each electrode.

(Second Embodiment)

In the first process, a semiconductor substrate 1 is prepared (FIG. 2).

In the second process, the P-layer 2, N-layer 3, N⁺-layer 4, and N⁺-layer 5 are formed in the substrate 1. The gate electrode 6 is formed in the N-layer 3 (FIG. 3).

Figure 12:
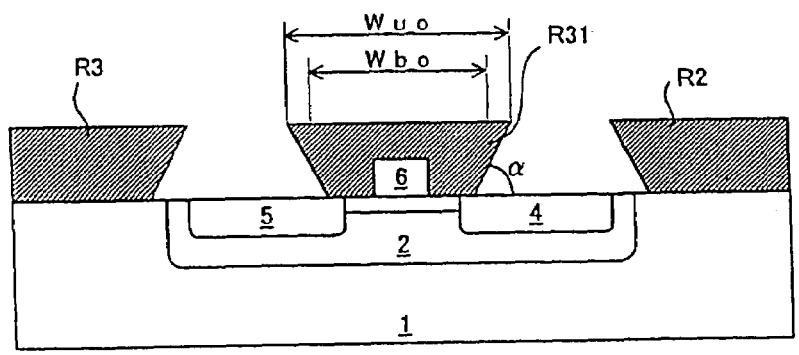
FIG. 12 is the third manufacturing process for the FET according to the second embodiment of the present invention.

In the third process shown in FIG. 12, a resist is coated and a photolithography is performed to form resist films (first pattern films) R31, R2 and R3. An opening between the resist films R31 and R2 is aligned to the position where the source electrode 7 is formed. An opening between the resist films R31 and R3 is aligned to the position where the drain electrode 8 is formed. The resist films R31, R2 and R3 are formed such that the sides thereof form an acute angle (approximately 70°) with respect to the upper surface of the substrate 1.

Figure 13:
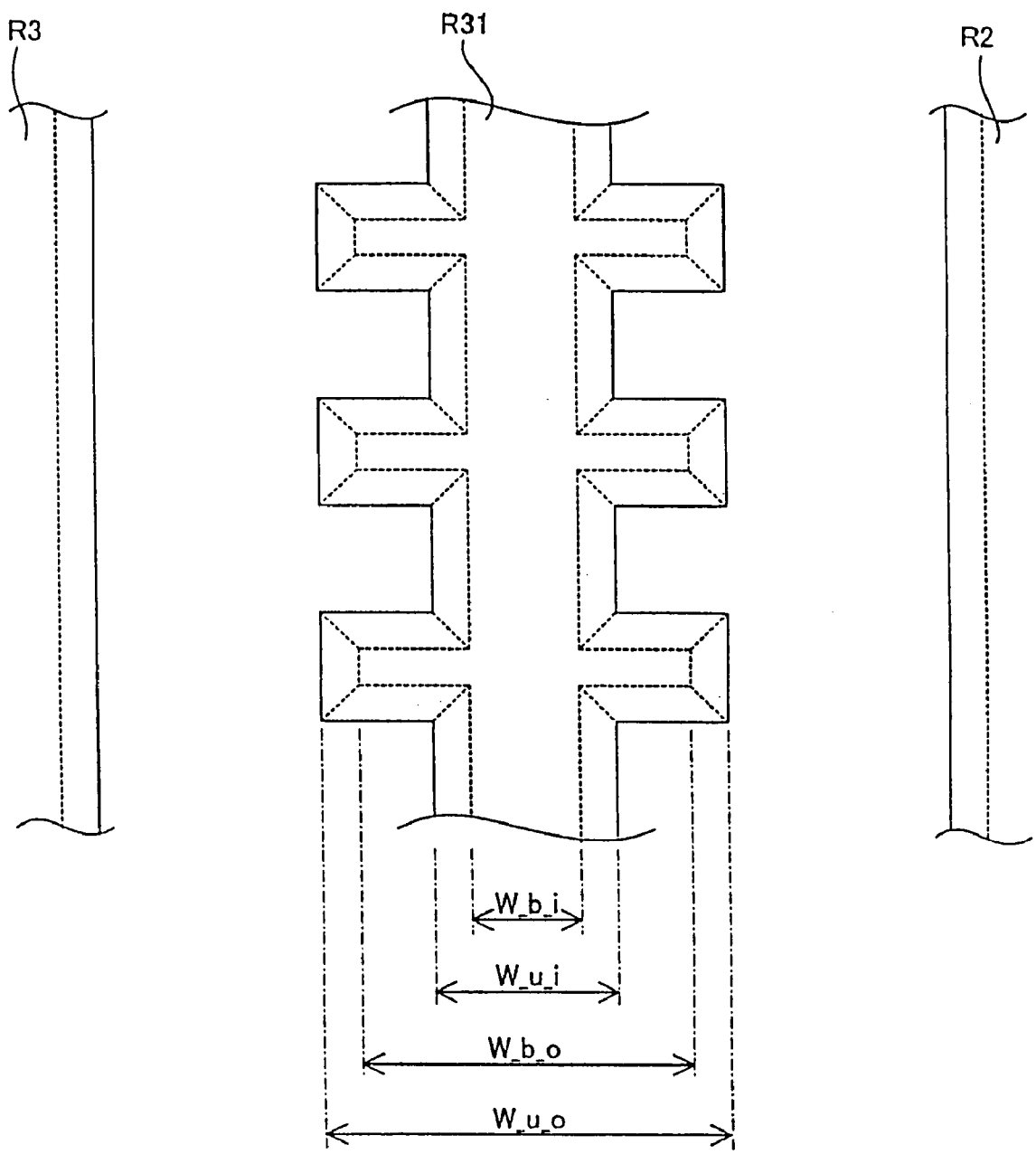
FIG. 13 is a top view of a resist film in the third manufacturing process of FIG. 12.

The resist film R31 has a unique shape to make small the distance between the source and drain electrodes 7 and 8 and prevent these electrodes from sloping or collapsing. FIG. 13 is a top view of the resist film R31.

The resist film R31 has a form of comb-teeth at both sides of the resist films R2 and R3. In FIG. 13, the real line indicates an external edge of the upper surface of the resist films R31, R2, and R3, and the dotted line indicates an external edge and ridgeline of the bottom surface thereof. Here, W_u_u denotes the width of the projecting portions of the upper surface of the resist film R31, W_u_i, the width of the dented portions thereof, W—b—O, the width of the projecting portions of the bottom surface, and W—b_i, the width of the dented portions thereof.

The shape of the upper surface of the resist film R31 gives a great influence on the distance between the source and drain electrodes 7 and 8. That is, the minimum distance between the source and drain electrodes 7 and 8 is substantially equal to the width of the dented portions of the upper surface of the resist R31 W_u_i and the maximum distance is substantially equal to the distance between the projecting portions thereof W_u_u.

The bottom surface of the resist film R31, especially the presence of the projecting portions, contributes to the stability of the posture of the resist film R31. When the width W_u_i is made small to make small the minimum distance between the source and drain electrodes 7 and 8, the width W—b_i is also made small inevitably. In the conventional structure, it is possible that the resist film R31 slopes. However, the presence of the projecting portions of the bottom surface makes the resist film R31 keep the stable posture until it is removed.

In the fourth process, an ohmic electrode material is applied from a direction perpendicular to the surface of the substrate 1 by vapor deposition or sputtering method. Since the resist films R31, R2, and R3 have the shapes of reverse-trapezoid, the ohmic electrode material is deposited on the upper surfaces of the resist films R31, R2, and R3 and in the openings between the resist films R31 and R2, and R31 and R3 to form ohmic electrode films OM34 and OM35, respectively (FIG. 5).

In the fifth process, the films R31, R2, and R3 are removed with the ohmic electrode films OM34 and OM35 formed thereon.

Figure 14:
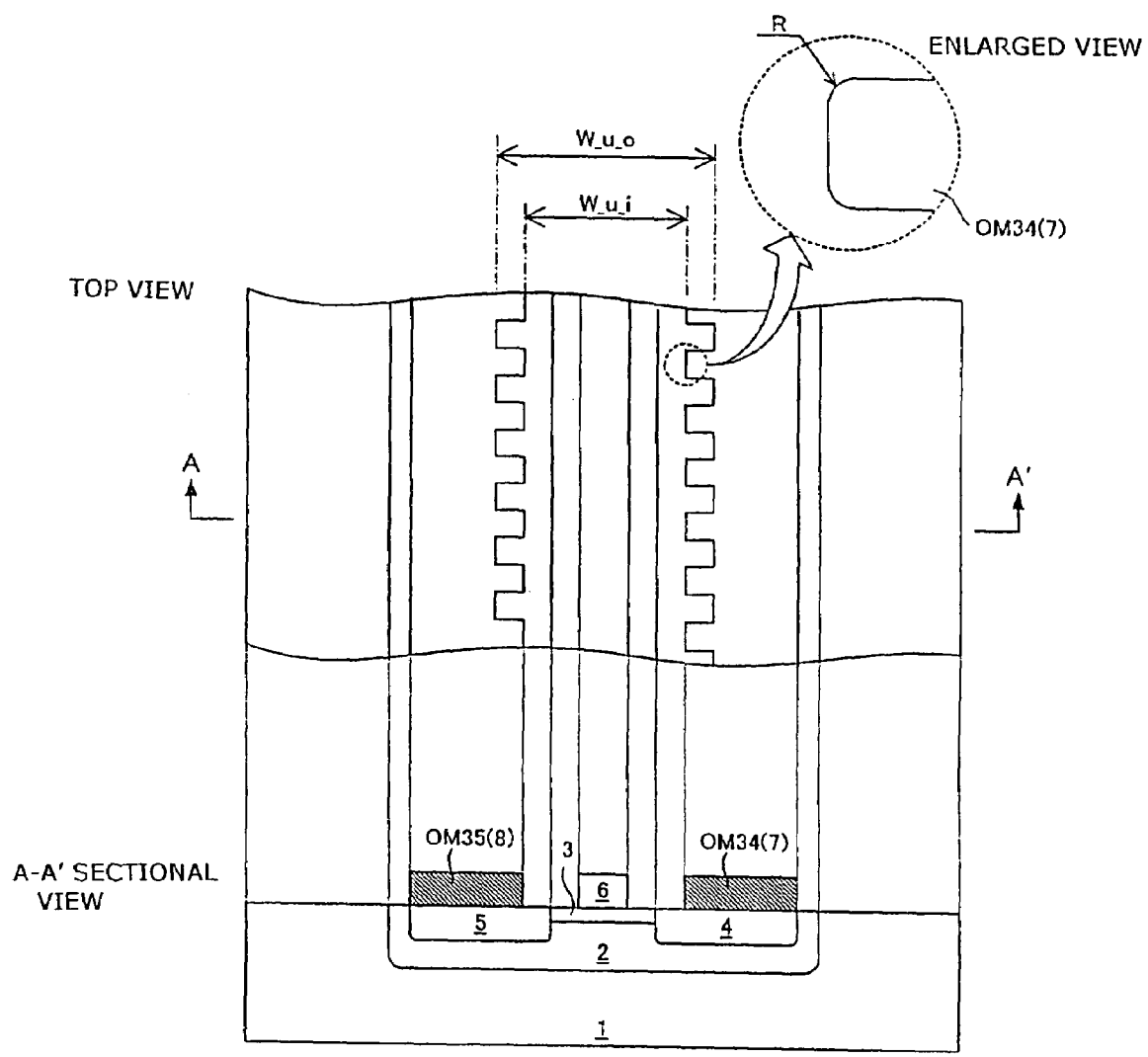
FIG. 14 is a combined view including top, sectional, and partially enlarged views of the FET manufactured by the method according to the second embodiment of the present invention.

The FET of FIG. 14 is provided through the above-described first to fifth process. The remaining ohmic electrode films OM34 and OM35 function as the source and drain electrodes 7 and 8, respectively.

As shown in FIG. 13, the resist film R31 has the projecting portions at both the sides opposing to the resist films R2 and R3. Accordingly, as shown in FIG. 14, the source and drain electrodes 7 and 8 have projecting portions. Since the projecting portions of the source and drain electrodes 7 and 8 are opposed to each other, the distance therebetween is the minimum distance between both the electrodes. As described above, the distance is substantially equal to the width of the dented portions of the upper surface of the resist film R31. According to the second embodiment, some positions between the source and drain electrodes 7 and 8 have small distance so that the resistances between the gate and source, and the gate and drain can be reduced. Consequently, characteristics, such as cut-off frequency, are improved.

Here, when the source and drain electrodes 7 and 8 are provided with the projecting portions, electrical charges are collected at the corners of the projecting portions of the electrodes. As shown in FIG. 14, it is preferable that the corners of projecting portions of the source and drain electrodes 7 and 8 have a curvature R to flow as much current as possible in the source and drain electrodes 7 and 8. The shapes of the projecting portions of the source and drain electrodes 7 and 8 are determined by the shape of the upper surface of the resist film P21. Accordingly, the photolithography in the third process is performed such that the corners of the dented portions of the upper surface of the resist film R31 are provided with the curvature R, thereby providing the corners of the projecting portions of the upper surfaces of the source and drain electrodes 7 and 8 with the curvature R.

In the second embodiment, it is described that the upper and bottom surfaces of the resist film R31 possess the projecting portions. However, since the resist film R31 has at least one dented portion in the upper surface thereof and at least one projecting portion in the bottom surface thereof, the posture of the resist film R31 is kept stable and the distance between the source and drain electrodes 7 and 8 is shortened. The resist film R31 may have projecting portions on only the side of either the source electrode 7 or the drain electrode 8.

The present invention is not limited to the above-described embodiments. It is obvious that a person having a skill in the filed would obtain various modifications or variations within the technical concept described in the claims. Accordingly, these modifications and variations should not excluded from the technical scope of the present invention.

In the embodiments, the method of manufacturing the FET is explained. However, the invention is applicable to other manufacturing process, such as wiring. Also, the invention is applicable to all pattern formations on the substrate besides the electrode.

As fully described, according to the invention, a fine pattern can be formed and the position of the pattern can be aligned precisely using the lift off method

The invention claimed is:

1. A method of forming a film, said method comprising the steps of:
   a first step of forming a pattern film having linear portions on at least two sides thereof and projecting portions with a comb-teeth shape in a plan view at the linear portions;
   a second step of depositing a material for first and second functional films using said pattern film; and
   a third step of removing said material, which is deposited on said pattern film, with said pattern film so that said material deposited in a first region, which is not covered with said pattern film, is left as said first functional film and said material deposited in a second region, which is not covered with said pattern film, is left as said second functional film, wherein in said first step, a shape of said pattern film is formed such that a bottom surface of said first functional film has at least one first projecting portion corresponding to the projecting portion at one of the two sides and extending toward said second functional film and a bottom surface of said second functional film has at least one second projecting portion corresponding to the projecting portion at the other of the two sides and extending toward said first functional film.

2. The method of forming a film according to claim 1, wherein said first and second projecting portions have curved corners.

3. The method of forming a film according to claim 1, wherein said pattern film has at least one dented portion at an edge of an upper surface thereof on a side of said first functional film and at least one dented portion at an edge of said upper surface thereof on a side of said second functional film.

4. The method of forming a film according to claim 1, wherein said pattern film has at least one of the projecting portions at an edge of a bottom surface thereof on a side of said first functional film and at least one of the projecting portions at an edge of said bottom surface thereof on a side of said second functional film.

5. The method of forming a film according to claim 1, wherein said first functional film is a first power supply electrode of a transistor and said second functional film is a second power supply electrode of said transistor.

6. The method of forming a film according to claim 1, wherein said first functional film is a first wiring film in a semiconductor device and said second functional film is a second wiring film in said semiconductor device.

7. A method of forming a film, said method comprising the steps of:
   a first step of forming a pattern film having a linear portion on at least one side thereof and a projecting pattern portion with comb-teeth shape in a plan view at the linear portion;
   a second step of depositing a material for first and second functional films using said pattern film; and
   a third step of removing said material, which is deposited on said pattern film, with said pattern film so that said material deposited in a first region, which is not covered with said pattern film, is left as said first functional film and said material deposited in a second region, which is not covered with said pattern film, is left as said second functional film, wherein in said first step, a shape of said pattern film is formed such that a bottom surface of said first functional film has at least one projecting portion corresponding to the projecting pattern portion and extending toward said second functional film.

8. The method of forming a film according to claim 7, wherein said projecting portion has a curved corner.

9. The method of forming a film according to claim 7, wherein said pattern film has at least one dented portion at an edge of an upper surface thereof on a side of said first functional film.

10. The method of forming a film according to claim 7, wherein said pattern film has the projecting pattern portion at least at an edge of a bottom surface thereof on a side of said first functional film.

11. The method of forming a film according to claim 7, wherein said first functional film is a first power supply electrode of a transistor and said second functional film is a second power supply electrode of said transistor.

12. The method of forming a film according to claim 7, wherein said first functional film is a first wiring film in a semiconductor device and said second functional film is a second wiring film in said semiconductor device.

13. A method of forming a film, comprising the steps of:
   forming a first pattern film on a substrate in a first region;
   forming a second pattern film on the substrate in a second region;
   forming a third pattern film on the substrate in a third region between the first region and the second region such that a first functional area is formed between the first pattern film and the third pattern film and a second functional area is formed between the second pattern film and the third pattern film, said third pattern film having a linear portion at a side facing at least one of the first pattern film and the second pattern film and a projecting portion with a comb-teeth shape in a plan view at the linear portion;

depositing a material on the substrate including the first, second, and third pattern films; and removing the first, second, and third pattern films together with the material formed thereon so that the material remains in the first functional area and the second functional area to form a first functional film and a second functional film, respectively.

14. The method of forming a film according to claim 13, wherein said first functional film is a first power supply electrode of a transistor and said second functional film is a second power supply electrode of the transistor.

15. The method of forming a film according to claim 13, wherein said first functional film is a first wiring film in a semiconductor device and said second functional film is a second wiring film in the semiconductor device.

* * * * *